United States Patent [19]

Chahbazian

[11] Patent Number: 5,339,043

[45] Date of Patent: Aug. 16, 1994

[54] WAVE PROPAGATION SIGNAL TRANSMISSION DEVICE AND APPLICATIONS OF THE DEVICE TO THE AMPLIFICATION OF SUCH SIGNALS

[75] Inventor: Jacques Chahbazian, Bruyeres le Chatel, France

[73] Assignee: Prana Recherche et Development, Bruyeres Le Chatel, France

[21] Appl. No.: 920,506

[22] PCT Filed: Dec. 20, 1991

[86] PCT No.: PCT/FR91/01056

§ 371 Date: Aug. 21, 1992

§ 102(e) Date: Aug. 21, 1992

[87] PCT Pub. No.: WO92/11693

PCT Pub. Date: Jul. 9, 1992

[30] Foreign Application Priority Data

Dec. 21, 1990 [FR] France .................. 90 16175

[51] Int. Cl.[5] .............................................. H03F 3/60
[52] U.S. Cl. ........................................ 330/56; 330/55; 330/286
[58] Field of Search .................... 330/53, 55, 56, 43, 330/45, 49; 315/3.5, 4

[56] References Cited

U.S. PATENT DOCUMENTS

| | | | |
|---|---|---|---|
| 2,435,585 | 2/1948 | Hartman | 330/49 X |
| 2,647,175 | 7/1953 | Sheer | 330/49 |
| 2,785,338 | 3/1957 | Goddard | 315/39 |
| 2,870,374 | 1/1959 | Papp | 315/39 |
| 3,247,420 | 4/1966 | Mayer | 315/42 |
| 3,750,043 | 7/1973 | Epsztein | 330/43 |
| 3,808,546 | 4/1974 | Nakazato et al. | 330/54 |
| 4,091,332 | 5/1978 | Crandall | 330/43 |
| 4,967,162 | 10/1990 | Barnett et al. | 330/43 |

FOREIGN PATENT DOCUMENTS

| | | | |
|---|---|---|---|
| 111502 | 9/1940 | Australia | 330/55 |
| 114277 | 12/1941 | Australia | 330/55 |
| 963185 | 7/1964 | United Kingdom . | |

Primary Examiner—James B. Mullins
Attorney, Agent, or Firm—Dennison, Meserole, Pollack & Scheiner

[57] ABSTRACT

The wave propagation signal transmission device according to the invention comprises two coupled distributed-constant wave propagation lines. The lines include active members of amplifying signals in transit in the form of linear and continuous components in parallel relationship. In particular, a cathode 318, and control grid 320, decoupling/accelerating screen grids 324, 326, receive, at E, HF signals to be amplified, and an anode 322 delivers, at S, amplified signals. Possible uses of the device according to the invention are high power and very wide band HF amplification and the generation of electromagnetic pulses very steep rise front and of long duration.

5 Claims, 3 Drawing Sheets

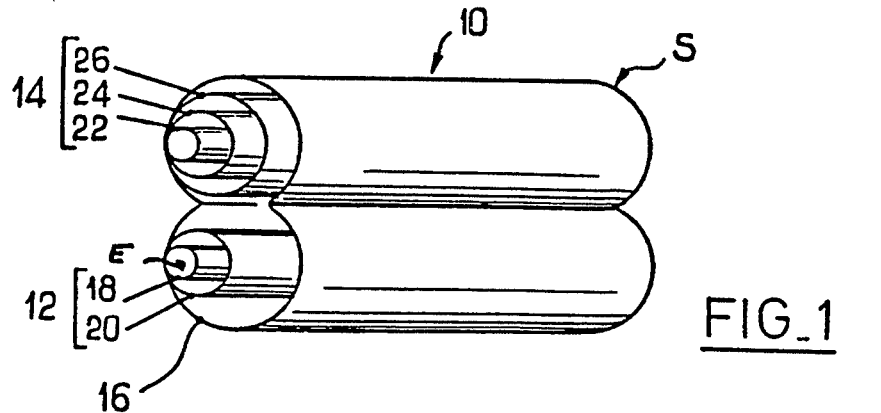
FIG._1
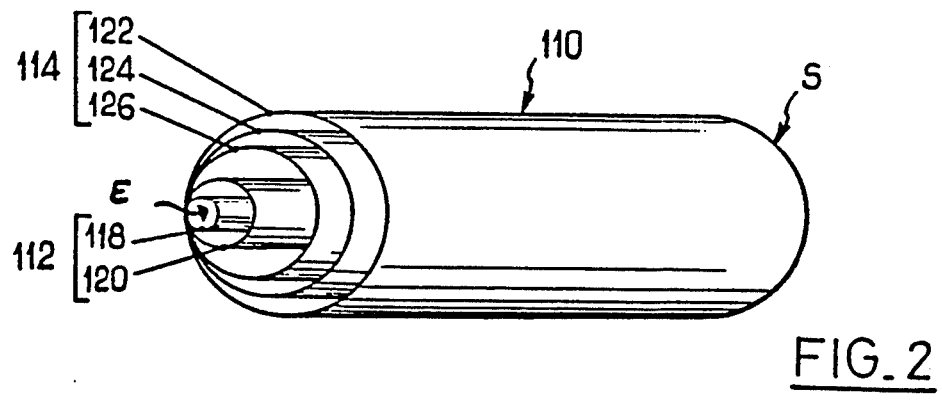
FIG._2
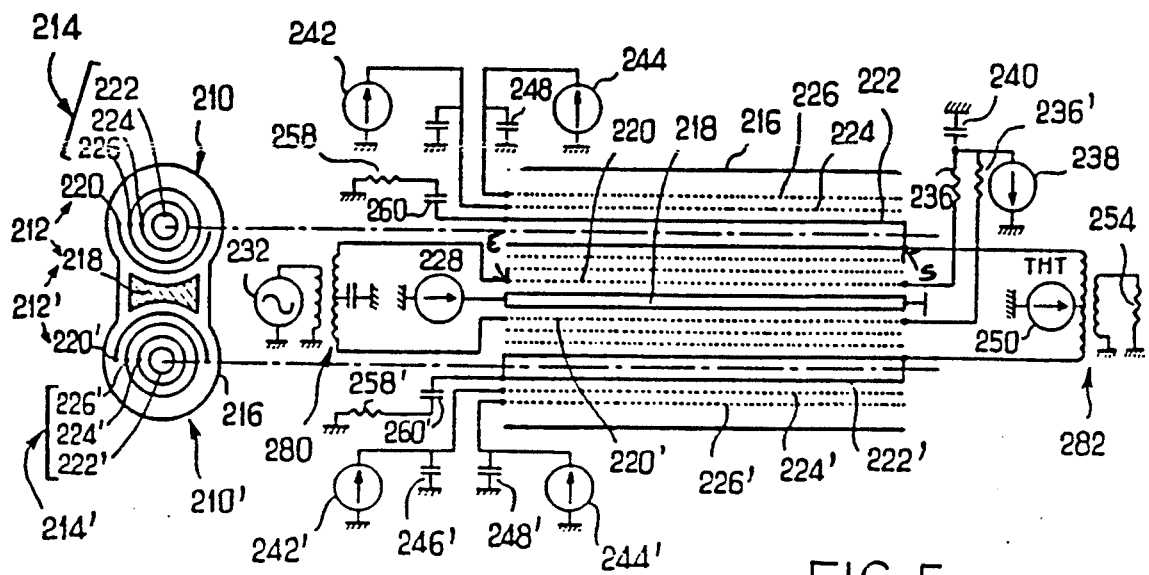
FIG._5

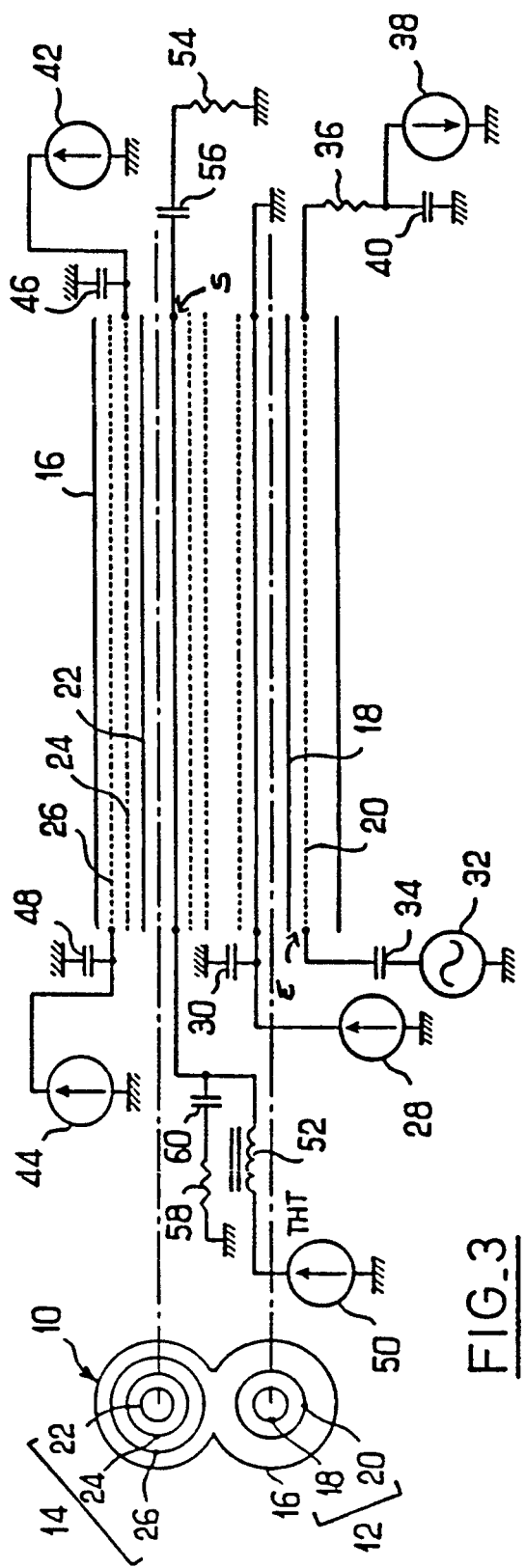
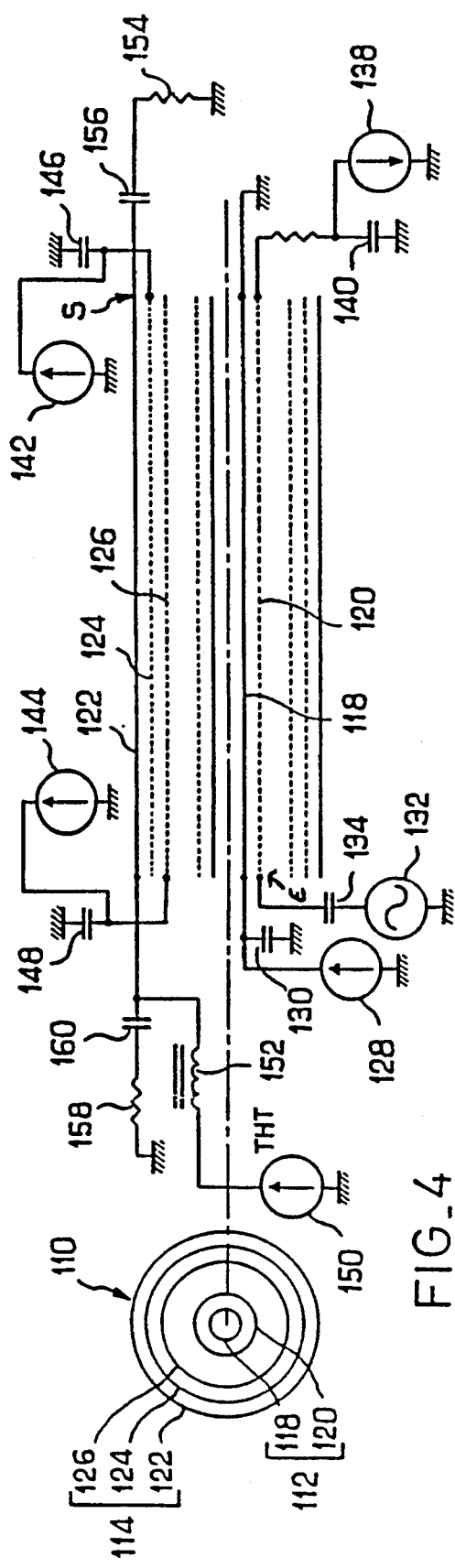
FIG_3
FIG_4

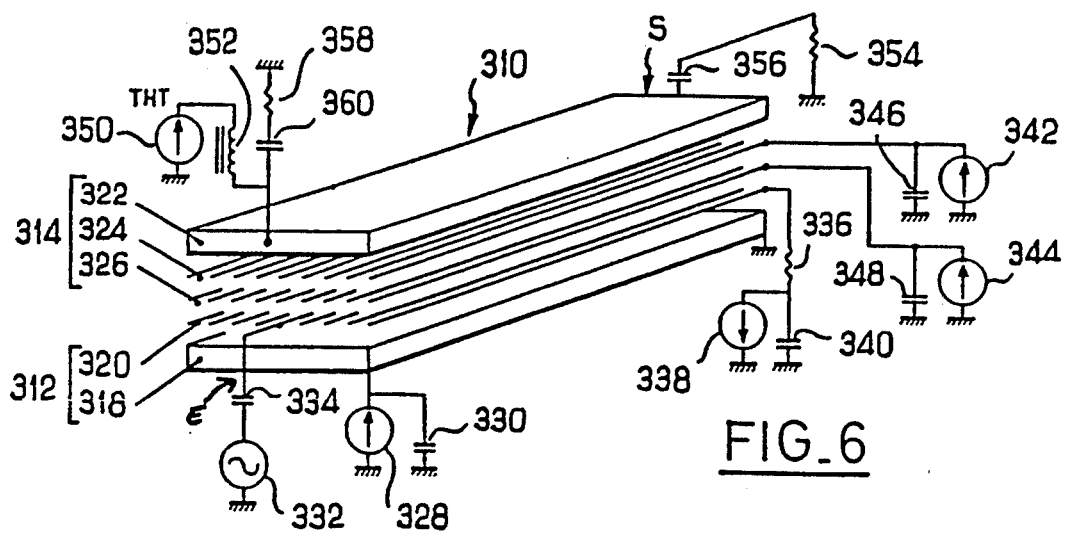
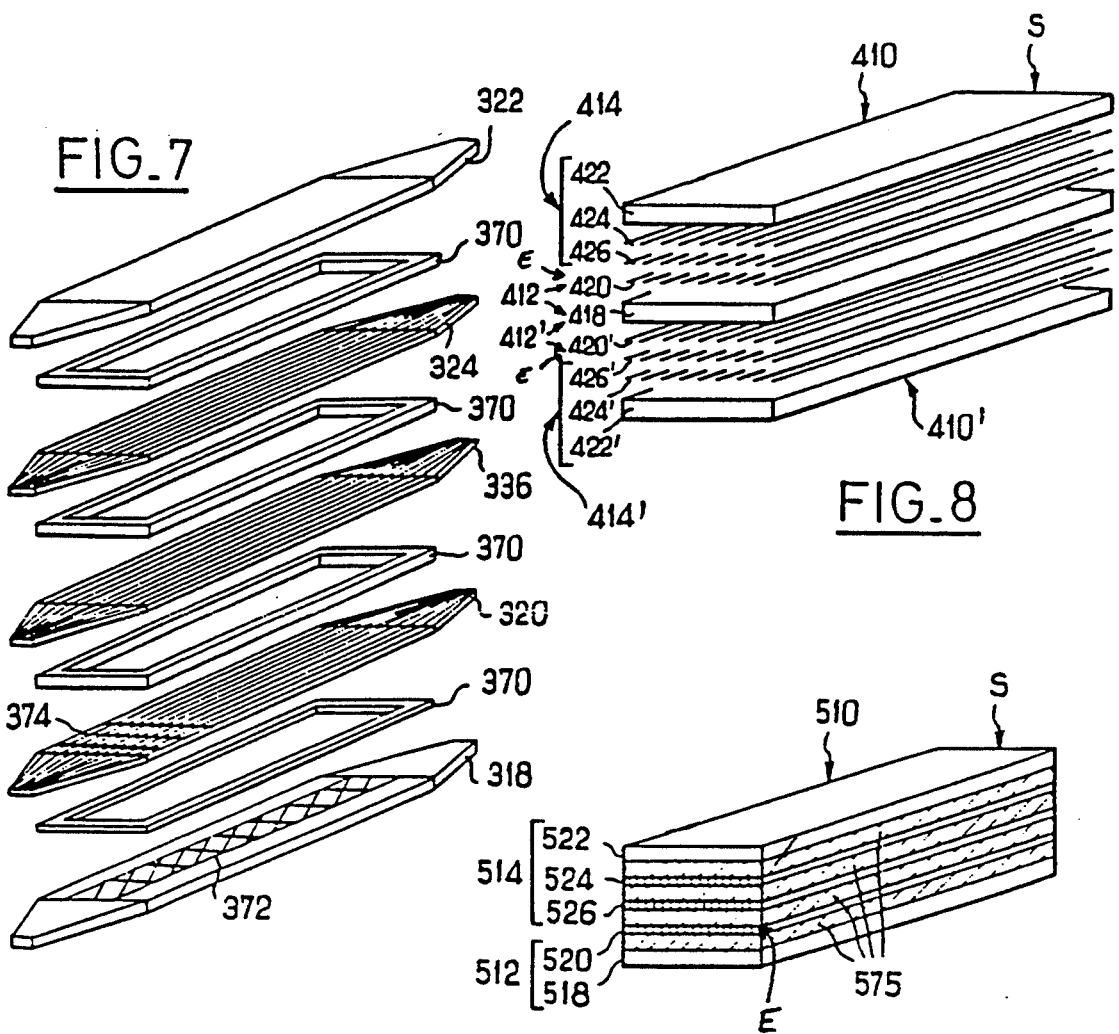

WAVE PROPAGATION SIGNAL TRANSMISSION DEVICE AND APPLICATIONS OF THE DEVICE TO THE AMPLIFICATION OF SUCH SIGNALS

BACKGROUND OF THE INVENTION

The present invention relates to wave propagation signal transmission devices of a novel type, usable in particular for the construction of wide band H.F power amplifiers.

The H.F. amplifier with wide passband (from LF to VHF) is customarily obtained with the aid of power tubes functioning with localised constants. These tubes possess dimensions and physical and electrical characteristics which are defined pointwise (current, input and output capacitances/inductances, amplifying ability between an input level and an output level, etc).

It has been proposed to increase the dimensions of vacuum tubes and the surface area of electrodes with the aim of enhancing the power amplification. The corresponding increase in input and output capacitances has the unfavourable effect of substantially reducing the passband of the amplifier tube (generally defined with respect to a power attenuation of −3db). In practice, the product "power gain×passband" is substantially constant for a given tube used alone or in an assembly of several tubes mounted in parallel.

It has also been proposed to construct an amplifier in part with distributed constants by constituting a distribution line in which the localised constants which the tubes represent are associated with complementary localised inductive elements to create a propagation line at input (the input capacitances associated with these inductances thereby producing a low-pass filter). Similarly, the output capacitances of the tubes are associated with localised inductive elements to create a propagation line at output connected to the unit's useful load. The U.S. Pat. No. 3,808,546 describes a configuration of this type in which a complete unit of several tubes is placed in a vacuum inside a common enclosure.

This solution, although representing an improvement, also has its limits in the field of HF amplification owing to the high values of the input and output capacitances of the tubes.

SUMMARY OF THE INVENTION

The invention aims in particular to produce improved performance wide band HF power amplifiers.

To this effect the invention proposes a wave propagation signal transmission device comprising, apart from means of propagating waves between an input point E and an output point S, active means of amplifying the signals in transit possessing two means each forming an electrode, a possibly controlled electrode emitting charge carriers on the one hand and an electrode collecting charge carriers on the other hand, said means each forming an electrode being integrated with the said wave propagation means and respectively associated the one with the signal input point E, the other with the signal output point S, the device being characterised in that the said wave propagation means comprise two coupled wave propagation structures with distributed constants, the one of the said structures integrating the said means forming an emitting electrode (cathode) and means forming a control grid, in the form of linear and continuous components inside the input propagation structure, the other of the said structures integrating the said means forming a collecting electrode (anode) and, optionally, means forming an acceleration, control or output/input decoupling screen, in the form of linear and continuous components inside the output propagation structure.

Thus integration in the form of linear and continuous components of the amplification means with the wave propagation means permits the distributing of the input and output capacitances along the wave propagation signal transmission means and the attenuating of their undesirable effects regarding reduction in the passband, whilst yet profiting from the increase in the amplified power resulting from the enhancement in the available active surface area of the electrodes in respect of the amplification functions; these surface areas depend directly on the dimensions of these same wave propagation means. For the remainder of the exposition, the device according to the invention will be referred to interchangeably as wave propagation device, wave propagation device with amplifier effect or simply amplifier.

To summarise, the linear and continuous configuration of the components of the HF amplifier (electrodes and control and acceleration grids) produced according to the present invention makes it possible to substantially increase the surface area of the electrodes simply by lengthening the propagation lines constituting the latter (and to obtain an enhancement of the output power) whilst limiting the influence of the input and output capacitances to preserve a wide passband for the amplifier. Similarly, the reduction in the electrical connections of the circuit by comparison with known circuits entails a reduction in the parasitic effects of the interconnection lines. Thus the device according to the invention possesses a simple and bare-essentials architecture based on two coupled propagation lines devoid of discrete elements, the whole structure of the device according to the invention having distributed constants.

Advantageously, in the wave propagation device according to the invention, the electrode emitting electrons or cathode is controlled from the signal input point E and the electrode collecting electrons or anode is associated with the signal output point S.

It should be noted that the coupling thus produced of the two wave propagation lines constituted on the one hand by the cathode and its control grid and on the other hand by the anode and its acceleration grid, makes it possible to obtain in addition to the conventional phenomenon of amplification of the HF signals output by a generator, the combining in the useful load of the HF output signals thus amplified in phase. A substantial increase is thus obtained in the output power without affecting the passband of the device.

According to a first variant embodiment of the invention, the wave propagation structures are of the coaxial type and are arranged either in a concentric layout or else in a juxtaposed layout. In the juxtaposed configuration a "push-pull" set-up of two amplifier subunits is likewise produced in the framework of the present invention according to technical characteristics detailed in the description below.

According to a second variant embodiment of the invention, the wave propagation structures are of the type with parallel linear plates or strips (two-plate or three-plate) the said structures being stacked face to face so as to arrange in the outer position the two plates integrating the electrodes. In this configuration with parallel linear plates ("strip-line") the "push-pull" set-up of two amplifier sub-units is likewise produced.

The invention is implemented in amplifier effect wave propagation signal transmission devices according to a technology of the type with evacuated enclosure or according to a "solid-state" type technology.

The invention also relates to applications of amplifier effect wave propagation signal transmission devices, in particular to H.F. amplification covering passbands reaching several gigahertz, to the generation of powerful electromagnetic pulses of long duration and with very steep rise front and to the simulation of lightning or similar waves.

According to yet another variant embodiment of the invention, a wave propagation signal transmission device is proposed comprising, apart from means of propagating waves between an input point E and an output point S, active means of amplifying the signals in transit possessing two means each forming an electrode, a possibly controlled electrode emitting charge carriers on the one hand and an electrode collecting charge carriers on the other hand, said means each forming an electrode being integrated with the said wave propagation means and respectively associated the one with the signal input point E, the other with the signal output point S, the device being characterised in that the said wave propagation means comprise two coupled unitary lines, taking the form for example of a layout of parallel plates or a coaxial layout, each unitary line constituting one of the said electrodes (cathode and anode respectively), means of control and of acceleration of the flux of charge carriers (electrons) taking a linear and continuous form being moreover associated with the two unitary lines.

Advantageously, the input line forms the cathode and the grid for control from the signal input point E, and the output line forms the anode associated with the signal output point S and the acceleration and decoupling grids.

Other advantages and characteristics of the present invention will emerge on reading the description which will follow in which, without limiting character, several embodiments of the invention are presented with reference to the attached drawings in which:

BRIEF DESCRIPTION OF THE DRAWINGS

FIG. 1 represents a partial schematic perspective view of a first embodiment of a wave propagation device according to the invention detailing the coaxial type wave propagation structures arranged in a juxtaposed layout, FIG. 2 represents a partial schematic perspective view of a second embodiment of a wave propagation device according to the invention detailing the coaxial type wave propagation structures arranged in a concentric layout, FIG. 3 represents the basic circuit diagram for an HF power amplifier according to the invention of the type with vacuum enclosure using the wave propagation structures illustrated in FIG. 1 (represented here in axial and diametral sections), FIG. 4 represents the basic circuit diagram for an HF power amplifier according to the invention of the type with vacuum enclosure using the wave propagation structures illustrated in FIG. 2 (represented here in axial and diametral sections), FIG. 5 represents the basic circuit diagram for an HF power amplifier according to the invention of the type with vacuum enclosure produced by "push-pull" set-up of two wave propagation devices according to the invention with juxtaposed coaxial type propagation structures (represented here in axial and diametral section), FIG. 6 represents the basic circuit diagram for an HF power amplifier of the type with vacuum enclosure constituted by a wave propagation device according to the invention with strip type propagation structure ("strip-line"), FIG. 7 represents an exploded view of an embodiment of the wave propagation structures incorporated in the device according to the invention represented in FIG. 6, FIG. 8 represents a perspective view of a stack of parallel linear plate type propagation structures which can be incorporated in a "push-pull" type HF power amplifier tube according to the invention, and FIG. 9 represents a perspective view of a stack of wave propagation structures, produced with "solid-state" technology and which can be used in a wave propagation device with the amplifier effect according to the invention.

DESCRIPTION OF THE INVENTION

The amplifier effect wave propagation device illustrated in FIG. 3 is obtained from wave propagation means represented in FIG. 1 consisting of an assembly 10 of two distributed constant wave propagation structures 12 and 14 of coaxial type which are juxtaposed and inserted into a protective envelope 16. For the remainder of the exposition it will be considered that the wave or the HF signals in transit along these propagation structures propagate from an input point (or end) E to an output point (or end) S.

The wave propagation device according to the invention which constitutes in a general way an HF power amplifier is produced from the setting up in a vacuum enclosure of the assembly 10 according to the basic diagram illustrated in FIG. 3 in order to obtain the "vacuum amplifier tube" variant of the invention, more exactly a distributed type evacuated wave propagation amplifier tube.

The first wave propagation structure or coaxial line 12 taking the form of linear and continuous components serves as emissive distributed source of electric charge carriers (in the present case electrons) from the core 18 of the line 12 whereas the body 20 functions as control grid intended to control on the basis of HF signals the electron flux emitted towards the second structure or coaxial line 14. The coaxial line 14 like-wise taking the forth of linear and continuous components functions as receiver of the emitted electrons. To this effect, the core 22 serves as electron collector and represents the anode, whereas the body, consisting by way of non-limiting example of two layers or screen grids 24 and 26, is used as acceleration and decoupling electrode to prevent the reverse propagation of output signals towards the input (since the amplified signals at the output must not disturb the signals to be amplified at the input).

The various electrodes and grids presented above are integrated into the amplification circuit illustrated in FIG. 3 as follows:

the cathode 18 is supplied by a heating circuit comprising a voltage generator 28 and a decoupling capacitor 30, the control grid 20 receives at the input point E of the wave propagation device 10 an HF signal to be amplified from an HF generator 32 across an input capacitor 34. The output point S of the grid 20 is connected by a load impedance 36 to a voltage generator 38 for biasing the grid 20 and to a decoupling capacitor 40, the two screen grids 24 and 26 are suitably biased independently by voltage generators 42 and which are associated with two decoupling capacitors and 48, the anode 22 is connected to a generator of very high voltage THT 50 (for example between 400 and 500 volts) by way of an inductor 52. This anode is suitably charged at the output point S by an application impedance (useful load) 54 across an output capacitor 56. The propagation line constituted by the anode 22 is matched to the input point E with the aid of a "reverse" load impedance 58 across an input capacitor 60.

Thus the electrodes and the control and screen grids which constitute active means of amplification of the HT signals are integrated in the form of linear and continuous components with the structures for propagating these same signals, the propagating being done in distributed mode.

The functioning of the amplifier illustrated in FIG. 3 ensues from that of a conventional vacuum tube of the cathode/control grid/anode type. However, the coupling thus produced of the two wave propagation lines constituted, on the one hand by the cathode 18 and its control grid 20, and on the other by the anode 22, makes it possible to obtain in addition to the conventional phenomenon of amplification of the HF signals output by the generator 32, the combining in the useful load 54 of the HF output signals thus amplified in phase. A substantial increase is thus obtained in the output power, without affecting the passband of the device. It is of interest to remark that the linear and continuous configuration of the components of the HF amplifier (electrodes and control and acceleration grids) produced according to the present invention makes it possible to substantially increase the surface area of the electrodes simply by lengthening the propagation lines constituting the latter (and to obtain an enhancement of the output power) whilst limiting the influence of the input and output capacitances to preserve a wide passband for the amplifier. Similarly, the reduction in the electrical connections of the circuit by comparison with known circuits entails a reduction in the parasitic effects of the interconnection lines.

By way of non-limiting example, the invention is usable in continuous mode (CW) as an HF amplifier with output powers greater than 1,000 watts and a passband which may reach several gigahertz. In pulse mode the invention is used to obtain output powers of the order of a hundred kilowatts (with a cathode surface area of about 1,000 cm2 for an electrode length close to one meter). In this pulse mode, the amplifier tubes according to the invention are used to generate powerful electronic pulses of long duration and with very steep rise front, or as attesters and/or as simulators of lightning or of similar waves and/or in rapid switching with amplification effect.

The invention also has other advantages, in particular by comparison with travelling wave tubes (T.W.T.), which are more fragile and more expensive, in particular that of having a lower content in amplification output harmonics owing to the improvement in linearity between the incoming and outgoing signals.

The amplifier effect wave propagation device illustrated in FIGS. 2 (in part) and 4 is similar to that illustrated in FIGS. 1 and 3 described earlier. The description of this second device according to the invention will not be repeated in detail below, however, the components which are identical or similar to those of the first device according to the invention already described with reference to FIGS. 1 and 3 are labelled in FIGS. 2 and 4 with the same numerical references (increased by 100) as those used for the description of the corresponding components of the first device according to the invention.

In this second amplifier effect wave propagation device which likewise takes the form of a vacuum tube, the two coupled wave propagation structures 112 and 114 are arranged in a coaxial configuration inside a vacuum enclosure. In this case, the structure constituting the controlled electron-emitting electrode (cathode 118 and control grid 120) is arranged at the centre of the configuration whereas the electron-collecting anode 122 is placed in a peripheral position as illustrated in FIGS. 2 and 4.

The functioning of the HF power amplifier of FIG. 4 is identical in its principle to that of the amplifier of FIG. 3.

The choice of one or other type of amplifier according to the invention will depend in fact on the desired use and on the two conditions of use. In effect, the amplifier of FIG. 3 with juxtaposed configuration seems better matched to high power gains for high frequencies. The amplifier of FIG. 4 is less bulky, more coherent and offers a greater uniformity of cathode/anode pathway. It is, however, more sensitive to the technology used for the input/output connections. Untimely couplings can appear entailing super-oscillations (pick-ups or self-oscillations) or undesirable attenuations in the amplified frequency band.

FIG. 5 shows another HF power amplifier according to the invention likewise in the form of a vacuum tube and incorporating a parallel so-called "push-pull" set-up with input and output transformers. Once again, the description of this amplifier which comprises a number of components identical or analogous to those described with reference to the amplifier illustrated in FIG. 3 will not be repeated in detail (the sa/ne numerical references will be used, increased by 200, for the corresponding components).

The HF amplifier of FIG. 5 is configured around a pair of two wave propagation units 210 and 210' arranged in a vacuum enclosure and each comprising two coupled coaxial type wave propagation structures in a concentric arrangement (212–214, 212'–214').

However, in the present configuration, the cathode 218, placed in a tangential intermediate position in respect of each unit 210 and 210' is common and is arranged halfway between the anodes 222 and 222' according to the symmetrical set-up illustrated in FIG. 5.

From the input point E, the input transformer 280 with centre-tapped secondary, controls the voltages of the control grids 220 and 220' from the primary mounted at the output of the HF generator 232. The transformer 280 enables the cathode 218 to be made to emit alternately towards anodes 222 and 222'.

The output transformer 282 has centre-tapped primary. Each half-primary is connected to the output point S of the corresponding anode 222 and 222' which work alternately one after the other. The useful load 254 is placed on the secondary.

The HF functioning in "push-pull" mode of the amplifier illustrated in FIG. 5 is conventional as regards this type of set-up of amplifier sub-units. Overall, "push-pull" set-ups permit an enhancement of outward power and an improvement in efficiencies.

FIG. 6 shows the basic diagram for an HF power amplifier according to the invention likewise in the form of a vacuum tube. Once again the description of this amplifier which comprises a number of components identical or analogous to those described with reference to the amplifier of FIG. 3 will not be repeated in detail (the same numerical references, increased by 300, will be used for the corresponding components). By comparison with the amplifiers described earlier whose coupled wave propagation structures were of the coaxial type, the amplifier of FIG. 6 incorporates in a vacuum enclosure two coupled wave propagation structures of the linear parallel plate or strip type, one two-plate referenced 312, the other three-plate referenced 314. The linear and continuous parallel plate structures ("strip-lines") 312 and 314 are stacked face to face so as to arrange in the outer position the two plates constituting the electrodes (the cathode 318 and the anode 322). The structure 312 also comprises the control grid 320 whose input point E is linked by the capacitor 334 to the HF voltage generator 332. The amplified HF signals are gathered in phase at the output S of the propagation structure 314 in the useful load 354 suitably associated with the anode 322.

FIG. 7 shows an exploded view of the stack of the coupled wave propagation structures of the amplifier illustrated in FIG. 6. The spacings between the electrodes 318, 322 and/or the grids 320, 326, 324 are predetermined by inserting ceramic frames 370 acting as bracing (possibly of different thicknesses).

In a variant (not shown) of the invention, the bracings form an integral part of ceramic partitions provided with grooves into which the grids are inserted; this set-up precludes possible leaks in ceramic/metal welds by diminishing the number of the latter.

By way of non-limiting example in the embodiment described here, the cathode is of the type with indirect heating (650° C.) produced on the basis of barium oxide and strontium oxide deposition.

The emissivity obtained lies between 0.2 and 0.3 amperes per cm2 of cathode surface area, which in pulsed mode makes it possible to obtain an emitted current of 200 to 300 mA/cm2 per watt of heating or in continuous mode (CW) an emitted current of 20 to 30 mA/cm2 per watt of heating.

Again by way of non-limiting example, a cathode surface area of 50 cm2 (25 cm of active length×2 cm of active width), makes it possible to obtain a mean plate current Ip of 10 amperes. The impedances of the input line and of the output line of the amplifier are chosen in conventional manner at 50 ohms. The matching of the two lines in particular at the level of the capacitances entails predetermined dimensions for the cathode-control grid and anode screen grid distances (the latter being fixed at about twice the former). This results in an active width of anode twice that of the cathode, namely in the example presented an anode width of the order of 4 cm. In practice, the cathode has an active central zone 372 such as represented diagrammatically in FIG. 7. The grids are produced according to a square mesh (represented partially at 374) of fine conducting wire with a spacing equal to four times the diameter of the wire.

As regards the bias voltages, the anode voltage Vp has been chosen between 400 and 500 volts, the voltage of control grid 320 Vg1 at −25 volts and the voltage of the accelerating screen grid Vg2 at 150V. Thus for an input signal on the control grid of +25 volts (across 50 ohms), an output signal VS of +250 volts (across 50 ohms) is obtained, the delivered plate current Ip peaking at 10 amperes.

FIG. 8 shows a diagrammatic view of a stack of two wave propagation units 410 and 410' each comprising two coupled strip propagation structures 412–414 and 412'–414'. In this particular "sandwich" set-up, the wave propagation units 410 and 410' are juxtaposed with the common cathode 418 in the median position. Such a configuration is used to produce an HF amplifier according to the invention of "push-pull" type according to an electrical circuit analogous to that described with reference to FIG. 5.

FIG. 9 shows a diagrammatic view of a stack 510 of propagation structures of parallel linear plate type, produced with "solid-state" technology usable in an amplifier effect wave propagation device according to the invention. By way of non-limiting example the cathode 518 and the anode 522 are produced from tungsten or nickel (possibly gold-plated) the control grids 520 and the screen grids 524 and 526 from a fine wire mesh, the electrodes and/or the grids being separated by layers 575 of semiconductor material preferably silicon-based. It should be noted in conclusion that "solid-state" technology is equally applicable to coaxial type wave propagation structures.

The invention is not limited to the embodiments described above. In particular, the invention relates equally to any device consisting of two coupled propagation lines placed in an evacuated enclosure (the lines being of coaxial type or of the "strip-lines" type) and in which the amplification function is produced as follows:

the conductor No. 1 of one of the lines, line A for example, is rendered active to fulfil the function of cathode and of source of electrons obtained by heating this conductor, the conductor No. 2 of this same line A serving to control, from HF signals injected at the input of the line, the electron flux emitted by the cathode;

the conductor No. 1 of the other line, line B for example, placed adjacent to the first (line A) serves in the output to input decoupling between the lines and to accelerate the electron flux in order to convey it to the conductor No. 2 of this other line B which fulfils the function of electron-collecting anode, this conductor No. 2 being associated at the output of line B with an application load for the amplified HF signals;

the whole constituting an amplifier as lines with distributed constants placed in a single evacuated envelope.

I claim:

1. Wave propagation signal transmitting device comprising:

a vacuum enclosure having at least two coupled parallel lines said enclosure including a first HF input and electron emitting line having in parallel relationship a linear continuous thermionic cathode electrode for emitting electrons and a linear control grid electrode, a second HF output and electron receiving line having in parallel relationship a linear continuous anode electrode for receiving electrons and linear decoupling/accelerating screen grid electrode means, said first and second lines being stacked face to face so as to arrange the cathode electrode and the anode electrode in an outer position, said first and second lines presenting at opposite ends thereof an input end and an output end, said linear control grid electrode being connected at the output end thereof to a load impedance and being adapted to receive a HF input wave signal at the input end thereof, said HF input signal for controlling electron flux emitted from the cathode, said anode electrode being connected at the input end thereof to a reverse load impedance and being adapted to deliver a HF output wave signal at the output end thereof connected to an useful load impedance after receiving the controlled electron flux from the first line, said cathode electrode, control grid electrode, decoupling/accelerating screen grid electrode means and anode electrode defining means for amplifying the input HF signal so as to generate through said controlled electron flux the output HF signal upon propagation of the HF signals from the input end to the output end of the lines, and said first and second lines presenting distributed inductive and capacitive constants and being coupled to obtain a distributed mode wave propagation of said output HF signals.

2. Wave propagation signal transmitting device according to claim 1, wherein said linear decoupling/accelerating screen grid electrode means include two parallel linear decoupling/accelerating screen grids located between said anode electrode and said control grid electrode in parallel relationship therewith.

3. Wave propagation signal transmitting device according to claim 1, wherein the anode electrode to screen grid electrode means distance is about twice the cathode electrode to control grid electrode distance and the active width of the anode is about twice the active width of the cathode.

4. Wave propagation signal transmitting device according to any of the claims 1, 2 or 3, wherein the cathode electrode, the control grid electrode, the decoupling/accelerating screen grid electrode means and the anode electrode are spaced by ceramic frames acting as bracing members.

5. Wave propagation signal transmitting device according to claim 1 or claim 2, wherein the control grid electrode and the decoupling/accelerating screen grid electrode means are made of fine conducting wires with a spacing between wires equal to about four times the diameter of the wire.

* * * * *